(12) United States Patent
Trimberger et al.

(10) Patent No.: US 10,665,579 B2
(45) Date of Patent: May 26, 2020

(54) CHIP PACKAGE ASSEMBLY WITH POWER MANAGEMENT INTEGRATED CIRCUIT AND INTEGRATED CIRCUIT DIE

(71) Applicant: Xilinx, Inc., San Jose, CA (US)

(72) Inventors: Stephen M. Trimberger, Incline Village, NV (US); Mohsen H. Mardi, Saratoga, CA (US); David M. Mahoney, Gilroy, CA (US)

(73) Assignee: XILINX, INC., San Jose, CA (US)

( * ) Notice: Subject to any disclaimer, the term of this patent is extended or adjusted under 35 U.S.C. 154(b) by 281 days.

(21) Appl. No.: 15/045,228

(22) Filed: Feb. 16, 2016

(65) Prior Publication Data

US 2017/0236809 A1    Aug. 17, 2017

(51) Int. Cl.
*H01L 23/00* (2006.01)
*H01L 25/18* (2006.01)
(Continued)

(52) U.S. Cl.
CPC .......... *H01L 25/18* (2013.01); *H01L 23/5385* (2013.01); *H01L 24/17* (2013.01); *H01L 25/0652* (2013.01); *H01L 25/0655* (2013.01); *H01L 25/0657* (2013.01); *H01L 25/16* (2013.01); *H01L 23/13* (2013.01); *H01L 24/05* (2013.01); *H01L 24/06* (2013.01); *H01L 24/13* (2013.01); *H01L 24/16* (2013.01); *H01L 24/81* (2013.01); *H01L 2224/0401* (2013.01); *H01L 2224/0557* (2013.01); *H01L 2224/06181* (2013.01); *H01L 2224/131* (2013.01); *H01L 2224/16145* (2013.01); *H01L 2224/16148* (2013.01); *H01L 2224/16227* (2013.01); *H01L 2224/1703* (2013.01); *H01L 2224/17181* (2013.01); *H01L 2224/81193* (2013.01); *H01L 2225/06513* (2013.01);
(Continued)

(58) Field of Classification Search
CPC ... H01L 2224/16225; H01L 2224/3225; H01L 2224/73265; H01L 2224/48091; H01L 2224/48227; H01L 2224/73204; H01L 2224/32145; H01L 23/49816; H01L 23/3128; H01L 23/49827; H01L 23/481; H01L 23/50; H01L 25/18; H01L 25/105; H01L 25/0657; H01L 25/06582; H01L 25/06506; H01L 25/5385
See application file for complete search history.

(56) References Cited

U.S. PATENT DOCUMENTS 6,084,308 A    7/2000  Kelkar et al.
6,255,899 B1   7/2001  Bertin et al.
(Continued)

FOREIGN PATENT DOCUMENTS

WO    2015020836 A2    2/2015

*Primary Examiner* — Farun Lu
(74) *Attorney, Agent, or Firm* — Patterson + Sheridan, LLP

(57) ABSTRACT

A chip package assembly is provided that includes a substrate, at least one integrated circuit (IC) die and a power management integrated circuit (PMIC). In one example, the IC die of the chip package assembly is disposed on a first surface of the substrate. The PMIC die has a first surface having outputs electrically coupled to the second surface of the IC die. The PMIC die also has a second surface facing away from the first surface. The second surface of the PMIC die has inputs that are electrically coupled to the first surface of the substrate.

20 Claims, 10 Drawing Sheets

(51) Int. Cl.
*H01L 25/065* (2006.01)
*H01L 23/538* (2006.01)
*H01L 25/16* (2006.01)
*H01L 23/13* (2006.01)

(52) U.S. Cl.
CPC ........... *H01L 2225/06517* (2013.01); *H01L 2225/06555* (2013.01); *H01L 2225/06568* (2013.01); *H01L 2225/06572* (2013.01); *H01L 2924/14* (2013.01); *H01L 2924/1431* (2013.01); *H01L 2924/1434* (2013.01); *H01L 2924/15153* (2013.01); *H01L 2924/15192* (2013.01); *H01L 2924/15311* (2013.01); *H01L 2924/19107* (2013.01)

(56) References Cited

U.S. PATENT DOCUMENTS

| | | | |
|---|---|---|---|
| 9,059,160 | B1 | 6/2015 | Sutardja |
| 2004/0036152 | A1 | 2/2004 | Harper et al. |
| 2006/0071648 | A1 | 4/2006 | Narendra et al. |
| 2011/0079905 | A1 | 4/2011 | Sanchez et al. |
| 2014/0103488 | A1 | 4/2014 | Chen et al. |
| 2014/0246773 | A1 | 9/2014 | Kent |
| 2015/0255366 | A1 | 9/2015 | Chung |
| 2016/0005715 | A1 | 1/2016 | Fazelpour et al. |
| 2016/0113115 | A1 | 4/2016 | Kwon et al. |
| 2016/0343929 | A1* | 11/2016 | Yu .................. H01L 24/17 |
| 2017/0084590 | A1* | 3/2017 | Yu .................. H01L 23/5389 |

* cited by examiner

CHIP PACKAGE ASSEMBLY WITH POWER MANAGEMENT INTEGRATED CIRCUIT AND INTEGRATED CIRCUIT DIE

TECHNICAL FIELD

Embodiments of the present invention generally relate to a chip package assembly, and in particular, to chip package assembly comprising at least one integrated circuit (IC) die and a power management integrated circuit (PMIC).

BACKGROUND

Electronic devices, such as tablets, computers, copiers, digital cameras, smart phones, control systems and automated teller machines, among others, often employ electronic components which leverage chip package assemblies for increased functionality and higher component density. Conventional chip package schemes often utilize a package substrate, often in conjunction with a through-silicon-via (TSV) interposer, to enable a plurality of integrated circuit (IC) dice to be mounted to a single package substrate. The IC dice may include memory, logic or other IC devices.

Chip package assemblies often utilize power management integrated circuit (PMIC) dice to control the power requirements. A PMIC die is a solid state device, such as an integrated circuit or system block in a system on chip, configured to the control power requirements of a host device or system. PMIC dice may perform one or more power management functions, such as DC to DC power conversion, battery charging, power source selection, voltage scaling, and power sequencing, among others. Exemplary circuits residing the in PMIC die may include, but are not limited to, one or more of a low-dropout regulator, pulse frequency modulator, switching amplifier, and others.

Power is generally provided to conductive contact pads formed on the bottom of the PMIC die through traces formed on a circuit printed board (PCB) to which the PMIC die is mounted. Power or other signal generated by the PMIC die is also routed from conductive pads formed on the bottom of the PMIC die through traces formed on the PCB to an integrated circuit (IC) die (or chip package assembly) mounted to the PCB. The length of the traces disposed on the PCB, along with the solder connections, contribute adversely to device performance, particularly as the power requirements and complexity of chip packages increase.

Therefore, a need exists for an improved architecture for IC die to PMIC die connection.

SUMMARY

A chip package assembly is provided which includes improved electrical power connection between an integrated circuit (IC) die and a power management integrated circuit (PMIC) die. In some examples, the electrical power connection between IC die and the PMIC die is not routed through a printed circuit broad (PCB).

In one example, a chip package assembly is provided that includes a substrate, at least one IC die and a power management integrated circuit (PMIC) die. The IC die of the chip package assembly is disposed on a first surface of the substrate. The PMIC die has a first surface having outputs electrically coupled to the IC die. The PMIC die also has a second surface facing away from the first surface. The second surface of the PMIC die has inputs that are electrically coupled to the first surface of the substrate.

In another example, the chip package assembly includes a first substrate, a second substrate, at least one integrated circuit (IC) die and a power management integrated circuit (PMIC). The IC die disposed on a first surface of the first substrate. The second substrate is mounted below the first substrate and electrically connected to the IC die through the first substrate. The PMIC die includes a first surface having outputs electrically coupled to a second surface of the first substrate. The PMIC die also includes a second surface facing away from the first surface. The second surface of the PMIC die has inputs that are electrically coupled to the first surface of the second substrate.

In yet another example, the chip package assembly includes a first substrate, a second substrate, at least one integrated circuit (IC) die and a power management integrated circuit (PMIC). A first electrical connector disposed on a first surface of the first substrate. The first electrical connector is electrically connected to a power input of the IC die. The PMIC die is disposed on the first surface of the second substrate. The PMIC die is connect to the power input of the IC die via an electrical conductor electrically connecting the first electrical connector and the second electrical connector.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

Chip package assemblies are described herein that improve device performance by closely mounting power management integrated circuit (PMIC) to the integrated circuit (IC) dice serviced by the PMIC dice, thus reducing R/C delays associated with conventional printed circuit board (PCB) mounted PMIC dice that rely on traces on the PCB for providing regulated voltage to the IC dice. In some embodiments, the PMIC die is not integrated within the chip package, but rather mounted on the PCB directly below the chip package (i.e., the IC die and supporting substrate(s) excluding the PCB), thereby eliminating package specific restrictions of an integrated PMIC-in-package assembly. In other embodiments, the PMIC dice may be integrated within the chip package by utilizing PMIC dice configured with electrical inputs and outputs on the top and bottom surfaces of the PMIC die.

Figure 1:
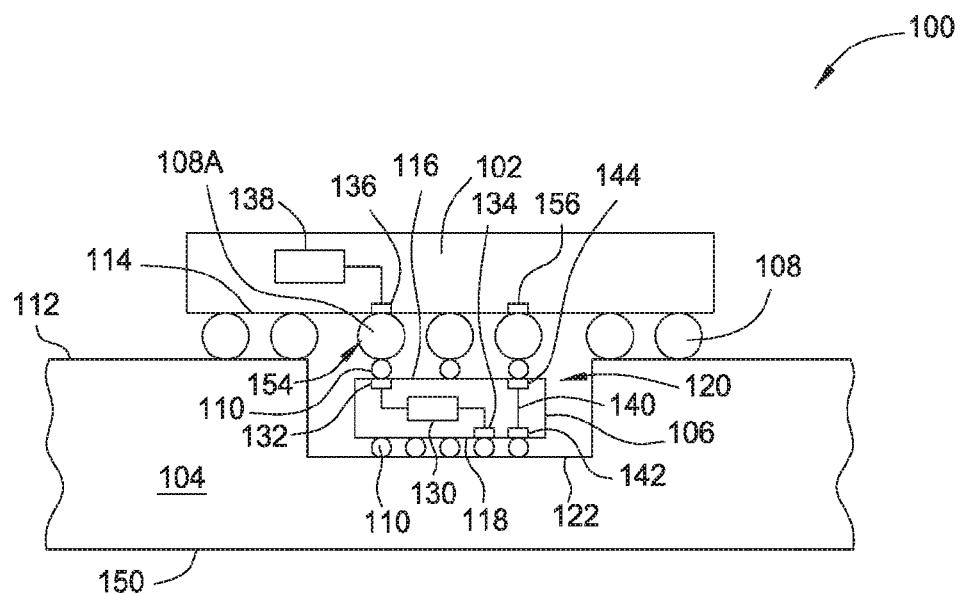
FIGS. 1-7 are cross sectional schematic views of chip package assemblies, each including a power management integrated circuit (PMIC) die disposed between at least one integrated circuit (IC) die and a substrate.

Turning now to FIG. 1, an exemplary integrated chip package assembly 100 is schematically illustrated. The chip package assembly 100 includes a PMIC die 106 disposed between at least one or more IC dice (one IC die 102 is shown) and a first substrate 104. The substrate 104 includes a first surface 112 facing toward the PMIC die 106 and a second surface 150 facing way from the first surface 112. The substrate 104 may be an interposer, package substrate or a PCB, as further discussed below. In the example depicted in FIG. 1, the substrate 104 is a PCB. In the example depicted in FIG. 1, the substrate 104 may be contoured to form a recess 120 such that the first surface 112 follows the contour of the recess 120.

The IC die 102 may be a programmable logic device, such as field programmable gate arrays (FPGA), a memory device, an optical device, a MEMS device, a processor or other IC logic or memory structure. Optical devices include photo-detectors, lasers, optical sources, and the like. The functionality of the IC die 102 is provided by solid state circuitry 138 formed in the die 102. The circuitry 138 is electrically connected to contact pads 136 formed on a first surface 114 of the IC die 102 to facilitate connection with the PMIC die 106 and other devices through the substrate 104. At least one of the contact pads 136 of the IC die 102 is a power input for providing power of the circuitry 138 of the IC die 102 from the PMIC die 106.

Some contact pads 136 of the IC die 102 are electrically and mechanically coupled to the first surface 112 of the substrate 104 by solder connections 108. Suitable solder connections 108 include package bumps, also known as "C4 bumps", that provide an electrical connection between the circuitry 138 of the IC die 102 and the circuitry (not shown) of the substrate 104. The IC die 102 may alternatively be coupled to the circuitry of the substrate 104 utilizing solder balls, wire bonding or other suitable technique.

The PMIC die 106 includes a first surface 116 facing toward the IC die 102 and a second surface 118 facing way from the first surface 116. The second surface 118 also faces toward the substrate 104. The PMIC die 106 includes circuitry 130 suitable for preforming the power management functionality of the die 106. The circuitry 130 may be solid state circuits, or system block in a system on chip device. The circuitry 130 may be configured to control power requirements of the IC die 102. The circuitry 130 may be configured to perform one or more power management functions, such as DC to DC power conversion, battery charging, power source selection, voltage scaling, and power sequencing, among others. Exemplary circuitry 130 residing the in PMIC die 106 may include, but are not limited to, one or more of a low-dropout regulator, pulse frequency modulator, switching amplifier, and others.

Power to the circuitry 130 of the PMIC die 106 is provide through inputs 134 exposed on the second surface 118 of the PMIC die 106. In the example depicted in FIG. 1, solder connections 110 electrically and mechanically couple the inputs 134 exposed on the second surface 118 of the PMIC die 106 to circuitry formed in the substrate 104. The solder connections 110 may be micro-bumps, solder balls, controlled collapse chip connection (C4) balls, wire bonding or other suitable technique.

Communication between the IC die 102 and the circuitry 130 of the PMIC die 106 may be provided via solder connections 154 formed between outputs 132 exposed on the first surface 116 of the PMIC die 106 and the contact pads 136 of the IC die 102. For example, one or more regulated voltage or other signal may be generated by the circuitry 130 of the PMIC die 106 and provided to the circuitry 138 of the IC die 102. In another example, control signals may be provided through the IC die 102 to control the function of the circuitry 130 of the PMIC die 106.

In the example depicted in FIG. 1, the solder connection 154 includes a first solder connection 108A and a second solder connection 110. The first solder connection 108A is in contact with the contact pads 136 of the IC die 102. The second solder connection 110 is in contact with the first solder connection 108A and the output 132 of the PMIC die 106. In other embodiments described therein having a recess 120, it may be advantageous to include solder connections 154 having first solder connections 108A connected to contact pads 136 of the IC die 102 and second solder connections 110 connecting the first solder connections 108A to the output 132 of the PMIC die 106.

The PMIC die 106 may also include a through via 140 formed between the surfaces 116, 118 of the die 106. For example, a first end of the via 140 terminates at a contact pad 144 exposed on the first surface 116 of the PMIC die 106 while a second end of the via 140 terminates at a contact pad 142 exposed on the second surface 118 of the PMIC die 106. Advantageously, the through via 140 may be utilized as a ground path to enable the ground terminals 156 of the IC die 102 to be directly routed to the circuitry of the substrate 104 while bypassing the circuitry 130 of the PMIC die 106. Providing the ground path using the through via 140 formed through the PMIC die 106 advantageously allows the PMIC die 106 to be utilized with IC dice 102 that have ground and power connections in close proximity. Connections between the terminals 156 of the IC die 102 and the contact pad 144 of the PMIC die 106 may utilized solder connections 154, as described above. Connections between the circuitry of the substrate 104 and the contact pad 142 of the PMIC die 106 may utilize solder connections 110, as described above.

As discussed above, the substrate 104, for example when embodied as a PCB, may include a recess 120 formed in the first surface 112 of the substrate 104. The recess 120 is sized to accommodate at least a portion of the PMIC die 106 therein. As such, the solder connections 110 between the PMIC die 106 and the substrate 104 are made through a bottom 122 of the recess 120 while the solder connections between the IC die 102 and the substrate 104 are made through the first surface 112 of the substrate 104. The recess 120 may be advantageously sized to accommodate the entire PMIC die 106 therein. For example, recess 120 may be sized to such that the first surface 116 of the PMIC die 106 is flush with, or below, the first surface 112 of the substrate 104. Having the PMIC die 106 flush or below the first surface 112 of the substrate 104 provides more design flexibility to accommodate standard configurations of dice and/or chip packages.

Additional chip package assemblies are described below with reference to FIGS. 2-8. In those chip package assemblies described in FIGS. 2-8, the details of the IC die 102 and PMIC die 106 are identical to that described with reference to FIG. 1 above, and as such, details such as the contact pads 136, 142, 144, ground terminal 156, inputs 134, outputs 132, through via 140, circuitries 130, 138 are not illustrated in FIGS. 2-8 to reduce drawing clutter. Thus, reference to the details of the IC and PMIC dice 102, 106 in the discussion of the examples illustrated FIGS. 2-8 should also be construed using the illustration of FIG. 1.

Figure 2:
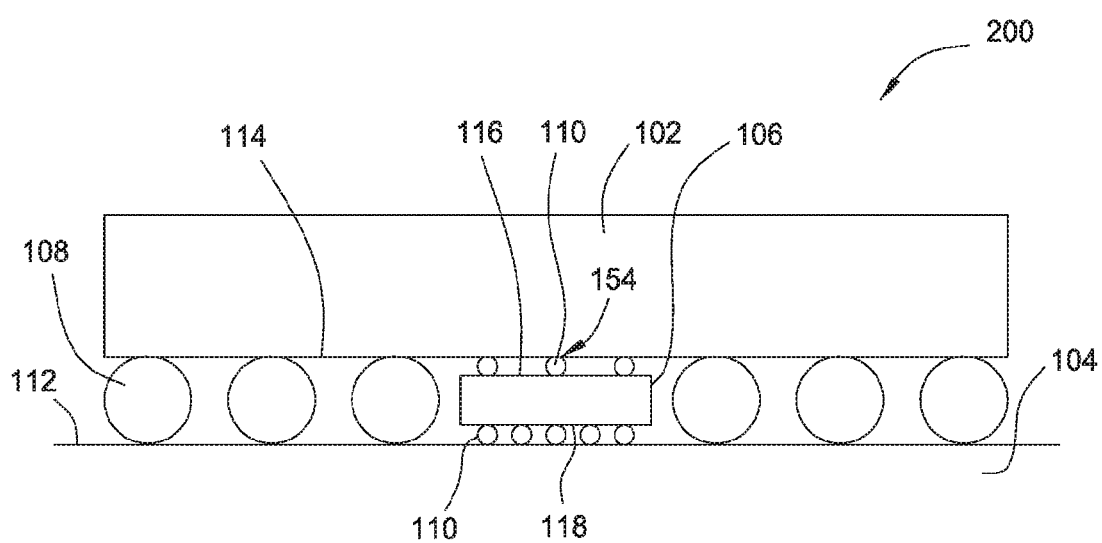

FIG. 2 is a schematic side view of another example of a chip package assembly 200 that includes a PMIC die 106 disposed between at least one or more IC dice (one IC die 102 is shown) and substrate 104. The chip package assembly 200 depicted in FIG. 2 is substantially similar to the chip package assembly 100 depicted in FIG. 1, example wherein the substrate 104 does not include a recess 120 formed in a first surface 112 of the substrate 104.

To facilitate positioning the PMIC die 106 between the IC die 102 and the substrate 104, the PMIC die 106 is thinned to a height substantially similar to that of the solder connections 108 coupling the IC die 102 and the substrate 104. In one example, the PMIC die 106 is thinned to a height of about 70 micrometers or less.

In the example depicted in FIG. 2, the first surface 116 of the PMIC die 106 is electrically and mechanically connect to the first surface 114 of the IC die 102 by solder connections 154, while the second surface 118 of the PMIC die 106 is electrically and mechanically connect to the first surface 112 of the substrate 104 by solder connections 110.

Figure 3:
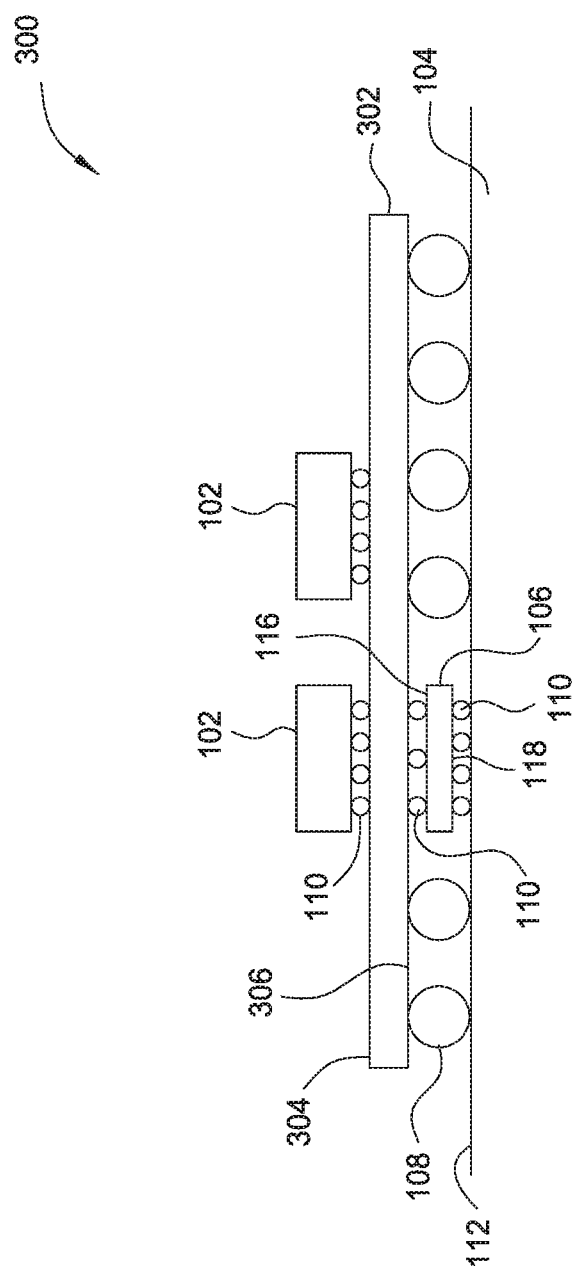

FIG. 3 is a schematic side view of another example of a chip package assembly 300 that includes a PMIC die 106 disposed between a first substrate 104 and a second substrate 302. The second substrate 302 may be an interposer or package substrate. The first substrate 104 may be a package substrate or a PCB. As known in the art, a package substrate has an upper surface adapted to provide electrical solder connections to dies or interposers, and a lower surface adapted to provide electrical solder connections to a PCB.

One or more IC dice 102 are coupled to the second substrate 302 via solder connections 110. The IC dice 102 may be any one or more of the types of IC dice 102 described above.

The PMIC die 106 is coupled on a first surface 116 to the second substrate 302 by solder connections 110. The PMIC die 106 is coupled on a second surface 118 to a first surface 112 of the first substrate 104 by solder connections 110.

Optionally, the PMIC die 106 of the chip package assembly 300 may be disposed in a recess 120, as shown and described with reference to FIG. 1.

Figure 4:
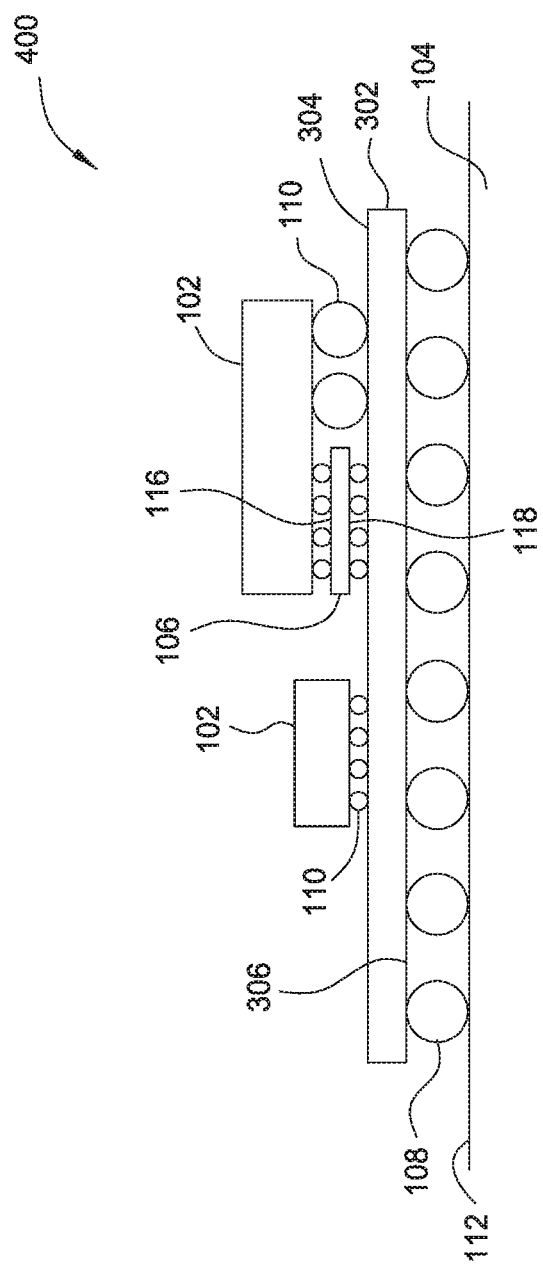

FIG. 4 is a schematic side view of another example of a chip package assembly 400 that includes a first substrate 104, a second substrate 302, a PMIC die 106 and one or more IC dice 102. The chip package assembly 400 is similar to the chip package assembly 300 described above, except wherein the PMIC die 106 is disposed between an IC die 102 and the second substrate 302.

Figure 5:
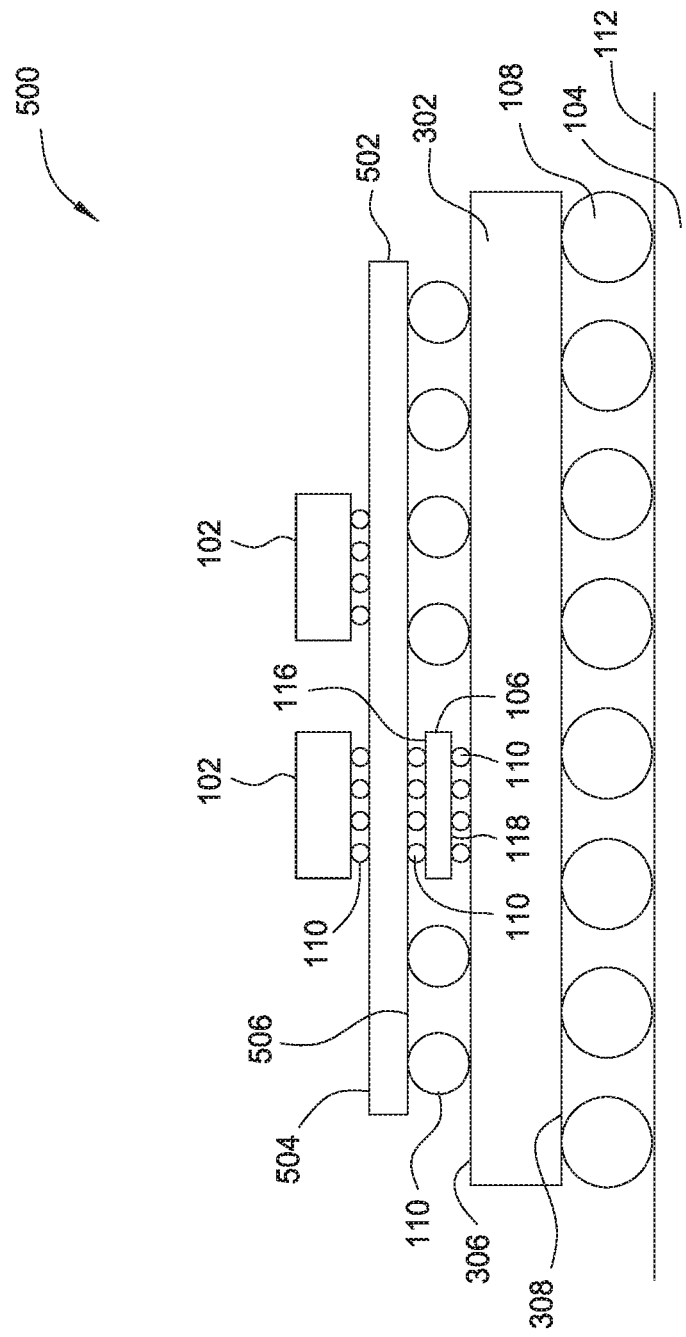

FIG. 5 is a schematic side view of another example of a chip package assembly 500 that includes a first substrate 104, a second substrate 302, a third substrate 502, a PMIC die 106 and one or more IC dice 102. The PMIC die 106 is disposed between the second substrate 302 and the third substrate 502. The second substrate 302 may be a package substrate. The third substrate 502 may be an interposer. The first substrate 104 may be a PCB. Circuitry (not shown) of the second substrate 302 may be coupled to the circuitry (not shown) of the third substrate 502 by solder connections 110.

The IC dice 102 are coupled to a first surface 504 of the third substrate 502 via solder connections 110. The IC dice 102 may be any one or more of the types of IC dice 102 described above. Circuitry 138 of the IC dice 102 may be coupled to the circuitry of the third substrate 502 by solder connections 110.

The PMIC die 106 is coupled to a second surface 506 of the third substrate 502. The second surface 506 of the third substrate 502 faces away from the first surface 504. The PMIC die 106 is coupled to a first surface 306 of the second substrate 302 by solder connections 110. The PMIC die 106 is coupled the circuitry of the second and third substrates 302, 502 by solder connections 110.

Figure 6:
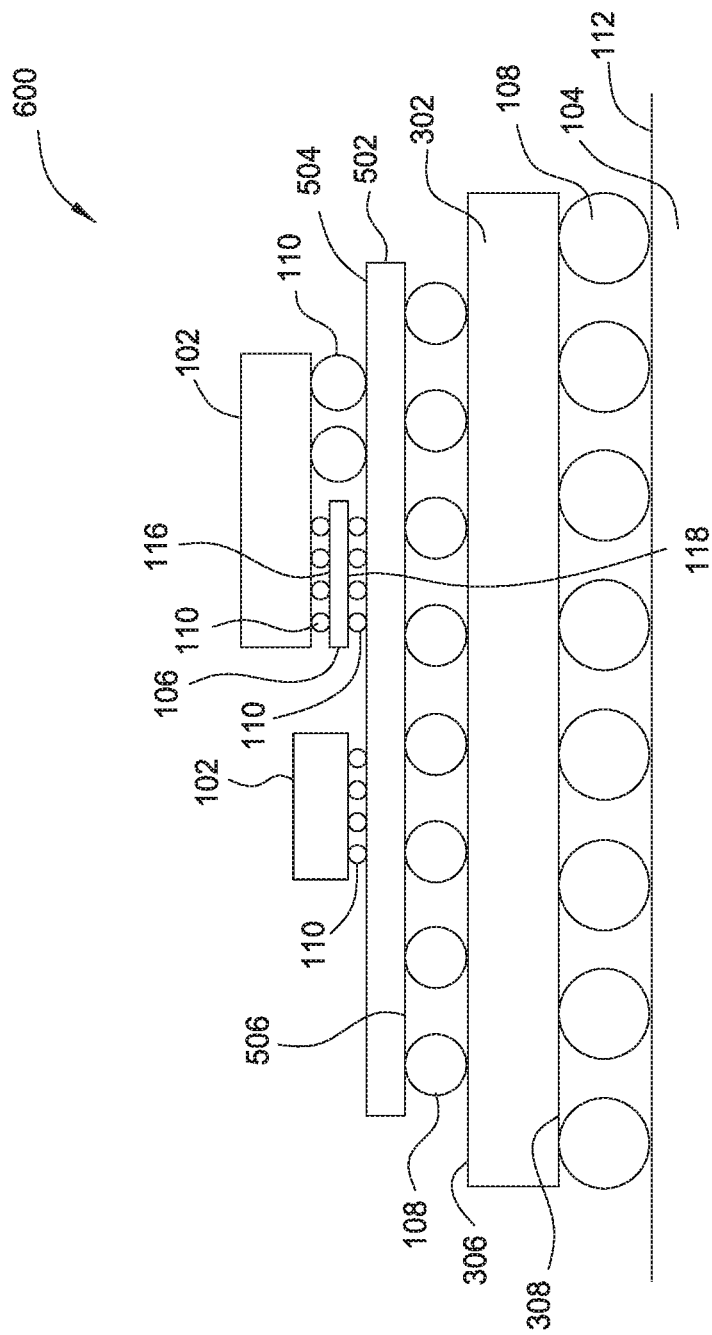

FIG. 6 is a schematic side view of another example of a chip package assembly 600 that includes a first substrate 104, a second substrate 302, a third substrate 502, a PMIC die 106 and one or more IC dice 102. The chip package assembly 600 is similar to the chip package assembly 500 described above, except wherein the PMIC die 106 is disposed between an IC die 102 and the third substrate 502.

Figure 7:
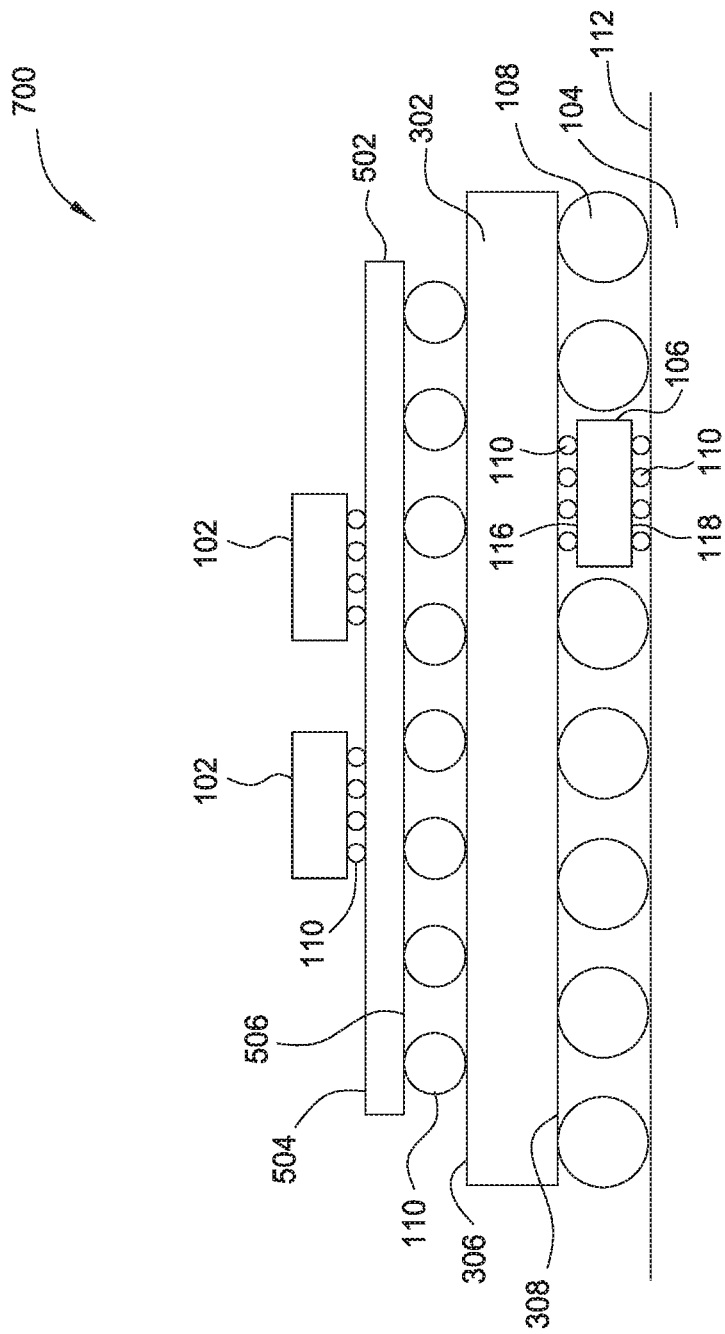

FIG. 7 is a schematic side view of another example of a chip package assembly 700 that includes a first substrate 104, a second substrate 302, a third substrate 502, a PMIC die 106 and one or more IC dice 102. The chip package assembly 700 is similar to the chip package assemblies 500, 600 described above, except wherein the PMIC die 106 is disposed between the first substrate 104 and the second substrate 302. Optionally, the PMIC die 106 of the chip package assembly 300 may be disposed in a recess 120, as shown and described with reference to FIG. 1.

Figure 8:
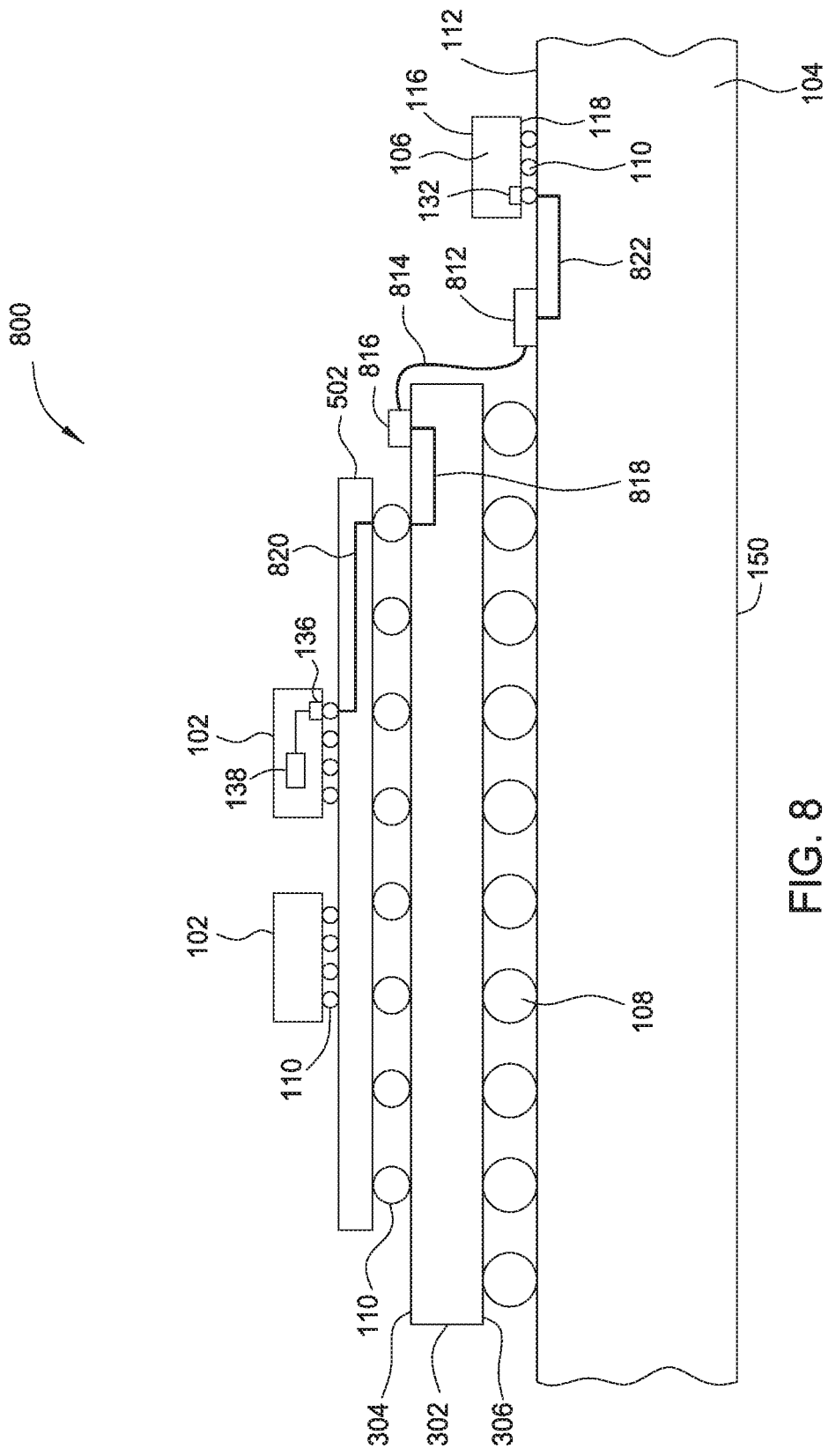
FIGS. 8-11 are partial sectional views of various examples of a chip package assembly having a PMIC die mounted on a printed circuit board (PCB), and coupled to a power input on an IC die via a cable extending between connectors disposed on the PCB and a substrate of the chip package assembly.

FIG. 8 is a schematic side view of another example of a chip package assembly 800 that includes a first substrate 104, a second substrate 302, a third substrate 502, a PMIC die 106 and one or more IC dice 102. The first substrate 104 may be a PCB. The second substrate 302 may be a package substrate. The third substrate 502 may be an interposer. Circuitry 138 of the IC dice 102 is connected to the circuitry (not shown) of the third substrate 502 via solder connections 110. Circuitry of the third substrate 502 is connected to the circuitry (not shown) of the second substrate 302 via solder connections 110. Circuitry of the second substrate 302 is connected to the circuitry of the first substrate 104 via solder connections 110. The PMIC die 106 includes a first surface 116 and a second surface 118, the first surface 116 facing away from the second surface 118, the second surface 118 facing the first substrate 104.

The second substrate 302 includes a connector 816 disposed on a first surface 304 of the second substrate 302. The connector 816 is configured to receive and electrically connect to a first end of a cable 814 disposed external to the second substrate 302. The cable 814 may be a flex cable, optical cable, coaxial cable or other conductor suitable for proprogating transmitted signals between the IC die 102 and the PMIC die 106. The connector 816 is coupled to one or more conductors 818 disposed on or in the second substrate 302. The conductor 818 is connected through one or more of the solder connections 110 disposed between the second and third substrates 302, 502 to circuitry 820 disposed on or in the third substrate 502. The circuitry 820 of the third substrate 502 is coupled through a solder connection 110 disposed between the third substrate 502 and IC die 102 to a contact pad 136 formed on a first surface 114 of the IC die 102 to facilitate connection of the circuitry 138 of the IC die 102 and the connector 816.

The first substrate 104 includes a connector 812 disposed on a first surface 112 of the first substrate 104. The connector 812 is configured to electrically connect to a conductor 822 formed on or in the first substrate 104. The conductor 822 is electrically coupled to the PMIC die 106 mounted on the first surface 112 of the first substrate 104.

A second end of the cable 814 is received by and electrically connected to the connector 812 disposed on the first substrate 104. Thus, the cable 814 electrically couples the circuitry 130 of the PMIC die 106 to the circuitry 138 of the IC dice 102. As the PMIC die 106 is remotely located from the components of the package (i.e., the IC dice 102 and supporting substrates 302, 502), greater flexibility is enabled for pairing a PMIC die 106 and with a particular package. For example, the PMIC die 106 may be directly interfaced with the package without impacting existing BGA pin layouts. Additionally, as the connector 812 is disposed on the first substrate 104 in close proximity to the second substrate 302, the length of the cable 814 is relatively short, thus providing improved signal transfer between the PMIC die 106 and the IC dice 102. Optionally, the connector 816 may be mounted to the first surface 116 of the PMIC die 106 to further short the resistance of the electrical connections between the PMIC die 106 and the IC dices 102, which also improves device performance.

Figure 9:
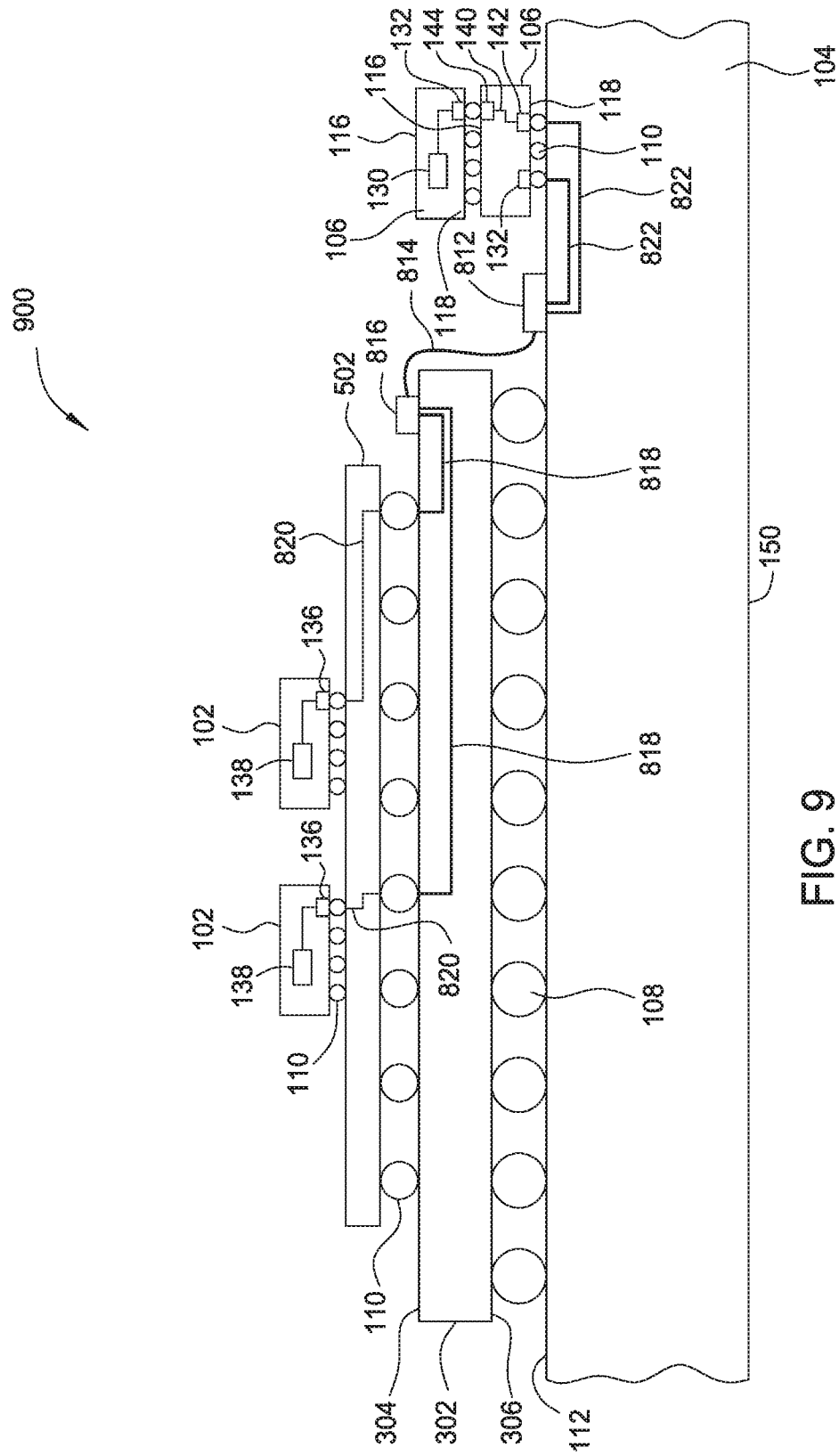

FIG. 9 is a schematic side view of another example of a chip package assembly 900 that includes a first substrate 104, a second substrate 302, a third substrate 502, at least two PMIC dice 106 and at least two or more IC dice 102. The chip package assembly 900 is essentially identical to the chip package assembly 800, except wherein the two PMIC dice 106 are stacked on a first substrate (i.e., PCB) 104, and communicate with at least two of the IC dice 102 through a single cable 814.

For example, the top PMIC die 106 may also include a through via 140 formed between the first and second surfaces 116, 118 of the die 106. For example, a first end of the through via 140 terminates at a contact pad 144 exposed on the first surface 116 of the bottom PMIC die 106, while a second end of the through via 140 terminates at a contact pad 142 exposed on the second surface 118 of the bottom PMIC die 106. The bottom PMIC die 106 is coupled to the first substrate 104. The through via 140 enables the circuitry 130 connected to the outputs 132 of the top PMIC die 106 to directly to communicate to the IC die 102 while bypassing the circuitry 130 of the bottom PMIC die 106. Although not shown in FIG. 9, the second surface 118 of the top PMIC die 106 may also include inputs 134 (as shown in FIG. 1) for receiving signals utilized to control the function of the top PMIC die 106.

Figure 10:
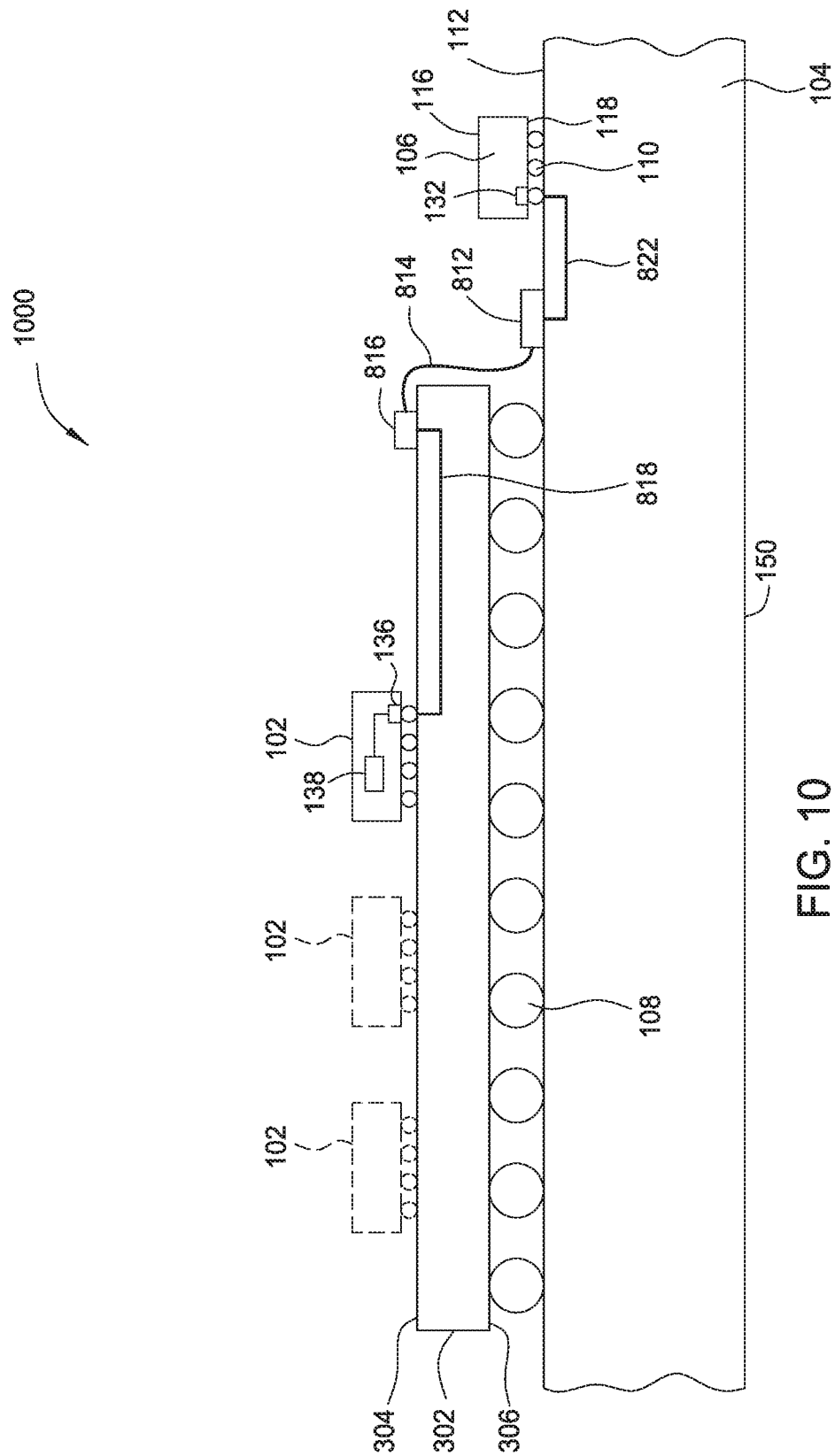

FIG. 10 is a schematic side view of another example of a chip package assembly 1000 that includes a first substrate 104, a second substrate 302, a PMIC die 106 and one or more IC dice 102. The chip package assembly 1000 is essentially identical to the chip package assembly 800, except wherein the second substrate 302 upon which the one or more IC dice 102 are mounted, is directly connected without an intervening substrate to the first substrate 104 upon which the PMIC die 106 is mounted.

Figure 11:
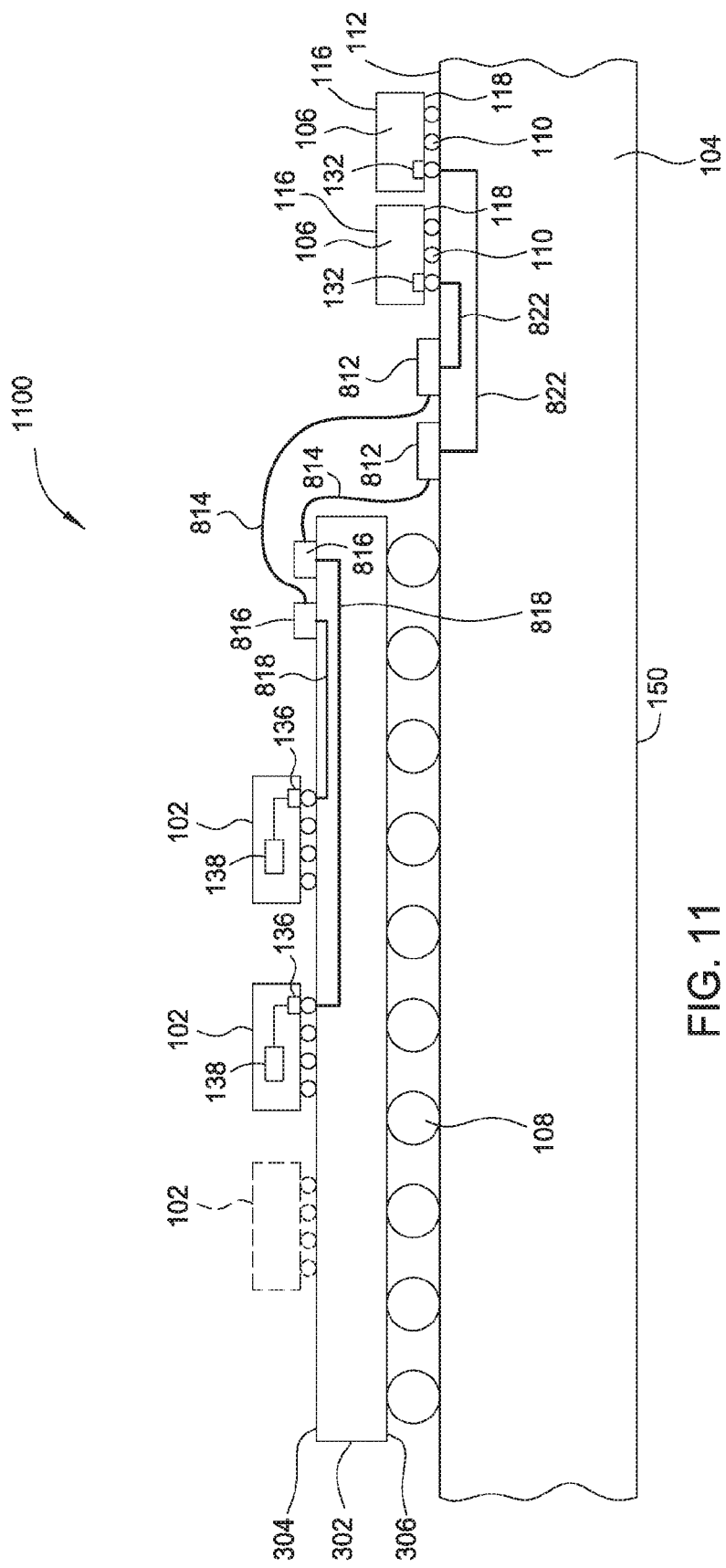

FIG. 11 is a schematic side view of another example of a chip package assembly 1100 that includes a first substrate 104, a second substrate 302, at least two PMIC dice 106 and at least two or more IC dice 102. The chip package assembly 1100 is essentially identical to the chip package assembly 800, except wherein the two PMIC dice 106 are mounted side by side in direct contract with the first substrate 104.

In the example depicted in FIG. 11, each output 132 of the PMIC die 106 is coupled by a conductor 822 to a connector 812 mounted to the first 104. A cable 814 is routed between the connector 812 and a connector 816 mounted to the second substrate 302. Conductors 818 disposed in or on the second substrate 302 are connected through solder connections 110 to the IC dice 102 mounted to the second substrate 302.

Alternatively, both PMIC dice 106 may communicate directly with at least two of the IC dice 102 through a single cable 814 routed between the first and second substrates 104, 302. For example, the conductors 822 formed in or on the first substrate 104 may be routed between each PMIC die 106 and a single one of the connectors 812 shown in FIG. 11. Similarly, the conductors 818 formed in or on the second substrate 302 may be routed between each IC die 102 and a single one of the connectors 816 shown in FIG. 11.

Thus, a chip package assembly has been provided which reduces R/C delays associated with conventional printed circuit board (PCB) mounted PMIC dice. In some embodiments, the PMIC die is mounted on the PCB directly below the chip package, thereby eliminating package specific restrictions of an integrated PMIC-in-package assembly. In other embodiments, the PMIC dice may be integrated within the chip package by utilizing PMIC dice configured with electrical inputs and outputs on the top and bottom surfaces of the PMIC die. In yet other embodiments, a cable is utilized to connect the PMIC to a chip package, thus allowing existing BGA pin configurations to be maintained while improving device performance.

While the foregoing is directed to embodiments of the present invention, other and further embodiments of the invention may be devised without departing from the basic scope thereof, and the scope thereof is determined by the claims that follow.

What is claimed is:

1. A chip package assembly comprising:
a substrate having a first surface facing away from a second surface, the first surface having a recess formed therein;
at least a first integrated circuit (IC) die disposed on the first surface of the substrate; and
a power management integrated circuit (PMIC) die disposed in the recess and having a first surface facing away from a second surface, the first surface of the PMIC die having outputs electrically coupled to the first IC die, the second surface of the PMIC die having inputs electrically coupled to a bottom of the recess formed in the first surface of the substrate, wherein at least one of the outputs electrically coupled to the first IC die provides power to the first IC die from the PMIC die and at least one of the inputs electrically coupled to the bottom of the recess formed in the first surface of the substrate provides power to the PMIC die.

2. The chip package assembly of claim 1, wherein the substrate further comprises:
a printed circuit board (PCB).

3. The chip package assembly of claim 2 further comprising:
solder connections electrically and mechanically connecting the first surface of the PCB to inputs exposed on the second surface of the PMIC die.

4. The chip package assembly of claim 3 further comprising:
solder connections electrically and mechanically connecting the IC die to outputs exposed on the first surface of the PMIC die.

5. The chip package assembly of claim 4, wherein the solder connections between the IC die and the PMIC die further comprise:
a first solder connection disposed in contact with the IC die; and
a second solder connection disposed in contact with the first solder connection and the outputs exposed on the first surface of the PMIC die.

6. The chip package assembly of claim 1, wherein the first surface of the PMIC die is disposed below the first surface of the substrate.

7. The chip package assembly of claim 1, wherein the substrate further comprises:
a package substrate.

8. The chip package assembly of claim 1, wherein the substrate further comprises:
an interposer coupled to a package substrate.

9. The chip package assembly of claim 7 further comprising:
solder connections electrically and mechanically connecting the IC die to outputs exposed on the first surface of the PMIC die.

10. A chip package assembly comprising:
a first substrate having a first surface facing away from a second surface;
a second substrate having a first surface facing away from a second surface, the second substrate mounted above the first substrate;
at least one integrated circuit (IC) die disposed on the first surface of the first substrate; and
a power management integrated circuit (PMIC) die having a first surface facing away from a second surface, the first surface of the PMIC die having outputs electrically coupled to the second surface of the second substrate, the second surface of the PMIC die having inputs electrically coupled to the first surface of the first substrate.

11. The chip package assembly of claim 10,
wherein the second substrate further comprises a package substrate and the first substrate further comprises a printed circuit board (PCB).

12. The chip package assembly of claim 11, wherein the PCB further comprises:
a recess in which at least a portion of the PMIC die is disposed.

13. The chip package assembly of claim 12, wherein the first surface of the PMIC die is disposed below the first surface of the PCB.

14. The chip package assembly of claim 12 further comprising:
a first solder connection disposed in contact with the package substrate; and
a second solder connection disposed in contact with the outputs exposed on the first surface of the PMIC die.

15. The chip package assembly of claim 10, wherein the second substrate further comprises an interposer and the first substrate further comprises a package substrate.

16. A chip package assembly comprising:
a first substrate having a first surface facing away from a second surface;
a first electrical connector disposed on the first surface of the first substrate;
a second substrate having a first surface;
a second electrical connector disposed on the first surface of the second substrate;
at least one integrated circuit (IC) die having a power input electrically connected to the second electrical connector;
a power management integrated circuit (PMIC) die disposed on the first surface of the first substrate, the PMIC die having outputs connected to the first electrical connector; and
an electrical cable electrically connecting the first electrical connector and the second electrical connector.

17. The chip package assembly of claim 16 further comprising:
a second PMIC die disposed on the first surface of the first substrate.

18. The chip package assembly of claim 16 further comprising:
a second PMIC die stacked on the PMIC die disposed on the first surface of the first substrate.

19. The chip package assembly of claim 18 further comprising:
an interposer disposed between the IC die and the second substrate.

20. The chip package assembly of claim 1, wherein the IC die is selected from the group consisting of a programmable logic device, a memory device, an optical device, and a MEMS device.

* * * * *